(12) United States Patent
Matsuda

(10) Patent No.: US 7,888,650 B2
(45) Date of Patent: Feb. 15, 2011

(54) LIGHT-EMITTING MATERIAL, SCINTILLATOR CONTAINING THE LIGHT-EMITTING MATERIAL, X-RAY DETECTOR EQUIPPED WITH THE SCINTILLATOR, IMAGE DISPLAY DEVICE USING THE LIGHT-EMITTING MATERIAL, AND LIGHT SOURCE USING THE LIGHT-EMITTING MATERIAL

(75) Inventor: Naotoshi Matsuda, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 11/966,311

(22) Filed: Dec. 28, 2007

(65) Prior Publication Data

US 2008/0179532 A1    Jul. 31, 2008

(30) Foreign Application Priority Data

Jan. 30, 2007  (JP) .............................. 2007-019274
Jul. 27, 2007  (JP) .............................. 2007-196135

(51) Int. Cl.
*G01T 1/20*    (2006.01)
*G01J 1/58*    (2006.01)

(52) U.S. Cl. ................................ 250/370.11; 250/458.1

(58) Field of Classification Search ............. 250/361 R, 250/370.11, 370.01, 458.1, 459.1; 252/301.4 F, 252/301.4 R See application file for complete search history.

(56) References Cited

U.S. PATENT DOCUMENTS 3,838,282 A * 9/1974 Harris ...................... 250/372
3,981,819 A * 9/1976 Yocom et al. ......... 252/301.4 S
4,752,424 A    6/1988 Matsuda et al.
6,504,156 B1 * 1/2003 Takahara et al. ........ 250/361 R
6,800,870 B2 * 10/2004 Sayag ........................ 250/584
2004/0062699 A1 * 4/2004 Oshio .......................... 423/263
2007/0272898 A1 * 11/2007 Yoshikawa et al. .... 252/301.4 H

OTHER PUBLICATIONS

Bergmann et al, Gmelin Handbook of Inorganic Chemistry, 8th Edition, Rare Earth Elements, C7, 1983, pp. 597.
Dorenbos, Energy of the First 4f7 4f65d Transition of Eu2+ in Organic Compounds, Journal of Luminescence 91, 2000, pp. 155-176.
Dorenbos, The 5d Level Positions of the Trivalent Lanthanides in Inorganic Compounds, Journal of Luminescence 91, 2000, pp. 155-176.
Shinoya et al, Phosphors for Lamps, 1999, pp. 391-394.
Shinoya et al, Phosphors for Cathcode-Ray Tubes, 1999, pp. 511-520.

* cited by examiner

*Primary Examiner*—David P Porta
*Assistant Examiner*—Faye Boosalis
(74) *Attorney, Agent, or Firm*—Turocy & Watson, LLP

(57) ABSTRACT

It is made possible to provide a light-emitting material having a short decay time of 10 µs or less and an emission wavelength of 650 nm or longer. A light-emitting material includes a material having a composition represented by $ARS_2$:Eu, wherein A represents at least one element selected from Na, K, Rb, and Cs, and R represents at least one element selected from Y, La, Gd, and Lu.

11 Claims, 11 Drawing Sheets

LIGHT-EMITTING MATERIAL, SCINTILLATOR CONTAINING THE LIGHT-EMITTING MATERIAL, X-RAY DETECTOR EQUIPPED WITH THE SCINTILLATOR, IMAGE DISPLAY DEVICE USING THE LIGHT-EMITTING MATERIAL, AND LIGHT SOURCE USING THE LIGHT-EMITTING MATERIAL

CROSS-REFERENCE TO RELATED APPLICATION

This application is based upon and claims the benefit of priority from prior Japanese Patent Applications No. 2007-19274 and No. 2007-196135 filed on Jan. 30, 2007 and Jul. 27, 2007 in Japan, the entire contents of which are incorporated herein by reference.

BACKGROUND OF THE INVENTION

1. Field of the Invention

The present invention relates to a light-emitting material, a scintillator containing the light-emitting material, an x-ray detector equipped with the scintillator, an image display device using the light-emitting material, and a light source using the light-emitting material.

2. Related Art

In recent years, there has been a growing demand for a fast-response and higher-sensitivity X-ray detector as the speed of X-ray CT (Computed Tomography) has become faster and the definition of X-ray CT has become higher. Currently, an X-ray detector mainly used is composed of a scintillator for converting X-ray into light and a light-receiving element for converting the light into electrical signals. Therefore, in order to realize a fast-response and higher-sensitivity X-ray detector, it is necessary to improve the properties of the scintillator and the emission properties of a light-emitting material constituting the scintillator. In order to realize a fast-response X-ray detector, it is necessary to use a light-emitting material having a short decay time. For example, when a decay time is defined as the time required for emission intensity to decay to 10%, the decay time of the light-emitting material is preferably 10 µs or less. Further, in order to realize a high-sensitivity X-ray detector, it is necessary to use a light-emitting material having a higher luminous efficiency, and at the same time it is preferred that the emission spectrum of the light-emitting material is highly matched with the sensitivity spectrum of a light-detective element used.

Such an x-ray detector currently used mainly has a silicon photodiode as a light-detective element. The spectral sensitivity distribution of the silicon photodiode has a peak in the near-infrared region, and therefore the emission wavelength of a light-emitting material used is preferably 650 nm or longer in the region from deep red to near-infrared.

Examples of known scintillators for X-ray detectors include a single crystal scintillator composed of NaI:Tl, a single crystal scintillator composed of $CdWO_4$, and a ceramic scintillator composed of $Gd_2O_2S$:Pr. These scintillators each have a decay time of less than 10 µs, and are therefore suitable for use in fast-response X-ray detectors. However, the peak emission wavelengths of these scintillators are 415 nm, 470 nm, and 510 nm, respectively, which are not sufficiently long from the viewpoint of matching with a silicon photodiode. In addition to them, a ceramic scintillator composed of $(Y,Gd)_2O_3$:Eu is also known. This ceramic scintillator has a peak emission wavelength of 610 nm which is longer than those of the above-mentioned scintillators but is not yet sufficiently long from the viewpoint of matching with a silicon photodiode. In addition, the ceramic scintillator composed of $(Y,Gd)_2O_3$:Eu has a decay time of 1 ms or longer, and is therefore not suitable for use in fast-response X-ray detectors. It is to be noted that the symbol (Y,Gd) represents a mixed crystal of Y (yttrium) and Gd (gadolinium).

Here, use of $Eu^{2+}$, which emits light by an allowed transition, as a luminescent center can be considered as one means for obtaining a light-emitting material having a short decay time. A list of light-emitting materials using $Eu^{2+}$ as a luminescent center is shown in a literature by P. Dorenbos (see J. Lumin., 104 (2003), pp. 239-260). In this list, light-emitting materials having an emission wavelength of 650 nm or longer are limited to chemically-unstable materials likely to react with water such as CaO and CaS and nitrides difficult to be synthesized.

Meanwhile, a phosphor is used as an important material exerting an influence upon the performance of devices used in various fields such as illumination, displays, and medical devices. The term "phosphor" used herein refers to one of light-emitting materials, and in the following description, the term "phosphor" can be used synonymously with the term "light-emitting material". For example, in the field of illumination, a phosphor exerts a great influence upon the performance, such as efficiency and color rendering properties, of fluorescent lamps and devices such as white LEDs which have been significantly technologically advanced in recent years. In the field of displays, emission properties of a phosphor greatly influence the image display performance of self-luminous display devices such as plasma display panels (PDPs) and field emission displays (FEDs). Further, in the case of nonluminous displays such as liquid crystal displays, a backlight exerts a great influence upon display performance, and therefore it is no exaggeration to say that a phosphor used for the backlight exerts a great influence upon the image display performance of liquid crystal displays. As has been described above, since a fluorescent material is used as an important material in various devices utilizing light emission and exerts an influence upon the performance of these devices, there has been a growing demand for a phosphor having improved emission properties.

In order to meet the demand, various light-emitting materials have been developed up to now and some of them are practically used as phosphors. Major phosphors are shown in various literatures such as PHOSPHOR HANDBOOK Edited by S. Shionoya and W. M. Yen, pp. 391-394, pp. 511-520, etc., CRC Press (1999), and the like, and some of them will be described below. A typical example of a display device excited by an electron beam includes a direct-view-type cathode ray tube (CRT). In such a direct-view-type CRT, ZnS:Ag,Cl or ZnS:Ag,Al is typically used as a blue light-emitting phosphor, ZnS:Cu,Al is typically used as a green light-emitting phosphor, and $Y_2O_2S$:Eu is typically used as a red light-emitting phosphor. These phosphors emit light highly efficiently when excited by a relatively low energy-density electron beam as in the case of a direct-view-type CRT. However, in a case where these phosphors are excited by a high energy-density electron beam, their luminous efficiency is lowered due to saturation. Therefore, in the case of a device excited by a high energy-density electron beam such as a projection-type CRT, phosphors which emit high-luminance light under excitation by a high energy-density electron beam, such as $Y_2SiO_5$:Tb as a green light-emitting phosphor and $Y_2O_3$:Eu as a red light-emitting phosphor, are used. However, there is no known blue light-emitting phosphor which emits light having a higher luminance than light emitted from a phosphor represented by ZnS and an excellent emission color under excitation by a high energy-density electron beam.

In the field of displays, flat panel displays have come to be widely used instead of CRTs in recent years. Among various flat panel displays excited by an electron beam, FEDs and SEDs (Surface-Conduction Electron-Emitter Displays) are receiving attention. The fluorescent materials of such FEDs and SEDs are excited by a higher energy-density electron beam than the phosphors of direct-view-type CRTs. Therefore, phosphors which are less likely to allow luminance saturation to occur are required for FEDs and SEDs, and particularly the advent of a blue light-emitting phosphor which emits light having a higher luminance than light emitted from a phosphor represented by ZnS under excitation conditions of FED or SED has been awaited. As a backlight light source for liquid crystal displays, a cold cathode fluorescent lamp is most commonly used. A typical example of a phosphor for use in the cold cathode fluorescent lamp includes a mixture of a blue light-emitting material represented by $BaMgAl_{10}O_{17}$:Eu (BAM), a green light-emitting material represented by $LaPO_4$:Ce,Tb, and a red light-emitting material represented by $Y_2O_3$:Eu.

On the other hand, an attempt has been recently made to use a white LED light source as a backlight light source. A typical example of a white LED light source includes a combination of a blue light-emitting diode (LED) and a yellow light-emitting phosphor represented by $(Y,Gd)_3Al_5O_{12}$:Ce. In order to satisfy a requirement to widen the color reproduction range of a liquid crystal display, it is preferred that when a light source is used together with red, blue, and green color filters to measure the chromaticity coordinates of red, blue, and green light, the area of a triangle formed on a chromaticity diagram by connecting the chromaticity coordinates of red, blue, and green light is made larger. Therefore, a phosphor for use in a backlight light source is required to have an emission spectrum satisfying the requirement, and the advent of a phosphor which can widen the color reproduction range of a liquid crystal display has been awaited. Further, from the viewpoint of production, the advent of a phosphor which can emit white light by itself has been awaited because the spectrum of a light source can be more easily controlled when white light is obtained by using only one kind of phosphor than when white light is obtained by mixing two or more phosphors. As has been described above, various phosphors have already been known, but the advent of phosphors having improved emission properties has been awaited to satisfy requirements varying depending on their purposes of use.

As has been described above, any conventional scintillators do not satisfy both the requirements of a short decay time and a long emission wavelength.

Further, as has been described above, the properties of the well-known light-emitting materials are not yet sufficient for many purposes of use, and therefore the advent of novel phosphors such as a blue light-emitting phosphor which emits light having a higher luminance than light emitted from a phosphor represented by ZnS and an excellent emission color under excitation by a high energy-density electron beam, and a white phosphor capable of realizing a backlight light source which can widen the color reproduction range of a liquid crystal display when used together with red, green, and blue color filters has been awaited.

SUMMARY OF THE INVENTION

The present invention has been made in view of these circumstances, and an object thereof is to provide, in addition to a light-emitting material having a short decay time of 10 µs or less and an emission wavelength of 650 nm or longer, a scintillator composed of the light-emitting material, an X-ray detector equipped with the scintillator, a light-emitting material which emits light having a higher luminance than light emitted from a phosphor represented by ZnS and an excellent emission color under excitation by a high energy-density electron beam and which can widen a color reproduction range, an image display device using the light-emitting material, and a light source using the light-emitting material.

A light-emitting material according to a first aspect of the present invention includes: a matrix having a composition represented by $ARS_2$, wherein A represents at least one element selected from Na, K, Rb, and Cs, and R represents at least one element selected from Y, La, Gd, and Lu.

A scintillator according to a second aspect of the present invention includes: a light-emitting material according to the first aspect.

An X-ray detector according to a third aspect of the present invention includes: a scintillator according to the second aspect; and a silicon photodiode for receiving light emitted from the scintillator.

An image display device according to a fourth aspect of the present invention includes: a first substrate; a red light-emitting pixel for emitting red light, a green light-emitting pixel for emitting green light, and a blue light-emitting pixel for emitting blue light which are provided on the first substrate; a second substrate provided so as to be opposed to the surface of the first substrate where the pixels are provided; a plurality of electron beam sources, each of which corresponds to each of the pixels and is provided on the surface of the second substrate opposed to the first substrate to emit an electron beam toward the corresponding pixel, wherein the blue-light emitting pixel contains the Bi-activated light-emitting material according to the first aspect.

A light source according to a fifth aspect of the present invention includes: a light-emitting material activated with Bi and Pr according to the first aspect; and a light-emitting device for irradiating the light-emitting material with light having a peak wavelength of 400 nm or less to excite the light-emitting material.

DETAILED DESCRIPTION OF THE INVENTION

Figure 1:
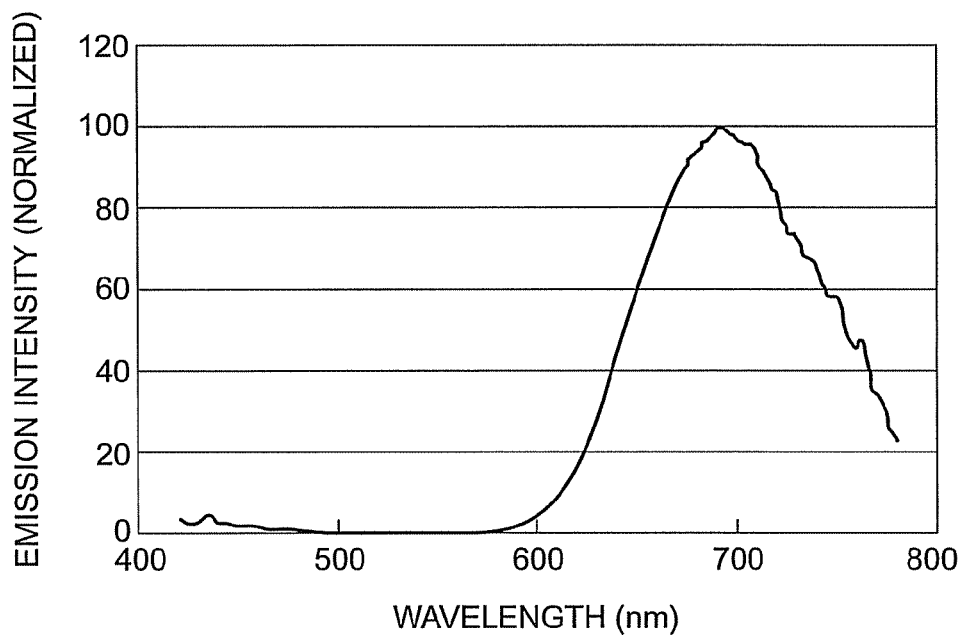
FIG. 1 is a diagram showing the emission spectrum of a light-emitting material according to a first embodiment composed of $NaYS_2$:Eu.

Hereinbelow, the present invention will be described in detail with reference to the following embodiments.

First Embodiment

A first embodiment of the present invention will be described.

A light-emitting material according to the first embodiment of the present invention has a composition represented by $NaYS_2$:Eu. The light-emitting material is obtained by adding Eu to a matrix represented by $NaYS_2$. As far as the present inventors know, a phosphor represented by this compositional formula has not yet been known. In addition, the present inventors have found that this phosphor exhibits unique light emission different from that of a Eu-activated phosphor usually used.

In a case where Eu is added to a matrix containing a rare-earth element such as Y, Eu usually exists as $Eu^{3+}$, and a line emission spectrum with a peak at about 610 nm to 630 nm unique to $Eu^{3+}$ is shown.

On the other hand, it is known that in a case where Eu is added to a matrix containing an alkaline-earth metal such as Ba or Sr, Eu often exists as $Eu^{2+}$, and a band emission spectrum unique to $Eu^{2+}$ is shown.

The present inventors have found that in a case where Eu is added to a matrix represented by $NaYS_2$, a band emission spectrum unique to $Eu^{2+}$ is shown in spite of the fact that the matrix contains a rare-earth element but does not contain an alkaline-earth metal. In addition, the present inventors have also found that this phosphor emits light in the longest wavelength region among phosphors containing Eu existing as $Eu^{2+}$. The reason for this remains unknown, but there is a possibility that the fact that the phosphor whose matrix does not contain an alkaline-earth metal shows light emission unique to $Eu^{2+}$ has some causal connections to the fact that the phosphor emits light in the longest wavelength region.

Hereinbelow, a method for producing a light-emitting material according to the first embodiment of the present invention will be described.

First, $Na_2S$, $Y_2S_3$, and $Eu_2O_3$ as raw materials were mixed in a molar ratio of 1.05:0.997:0.003, and more specifically, 20.49 g of $Na_2S$, 68.29 g of $Y_2S_3$, and 0.264 g of $Eu_2O_3$ were weighed and then mixed. The mixture was charged into a carbon crucible and fired in a hydrogen sulfide atmosphere at 1,000° C. for 1.5 hours. The thus obtained fired product had a pink color. The fired product was milled in a mortar, washed with water, and dried to obtain a powdery light-emitting material. Significant dissolution or decomposition of the light-emitting material was not observed even when the light-emitting material was washed with water.

The powdery light-emitting material was analyzed by X-ray diffraction, and as a result, it was confirmed that $NaYS_2$ was produced and that the light-emitting material had a composition represented by $NaYS_2$:Eu. The light-emitting material was excited by a pulsed electron beam having an acceleration voltage of 10 kV to evaluate the decay characteristics of the light-emitting material. As a result, the decay time of the light-emitting material, during which the emission intensity thereof was reduced to 10%, was 7 μs. From the result, it was confirmed that the light-emitting material had a sufficiently short decay time of 10 μs or less.

Figure 2:
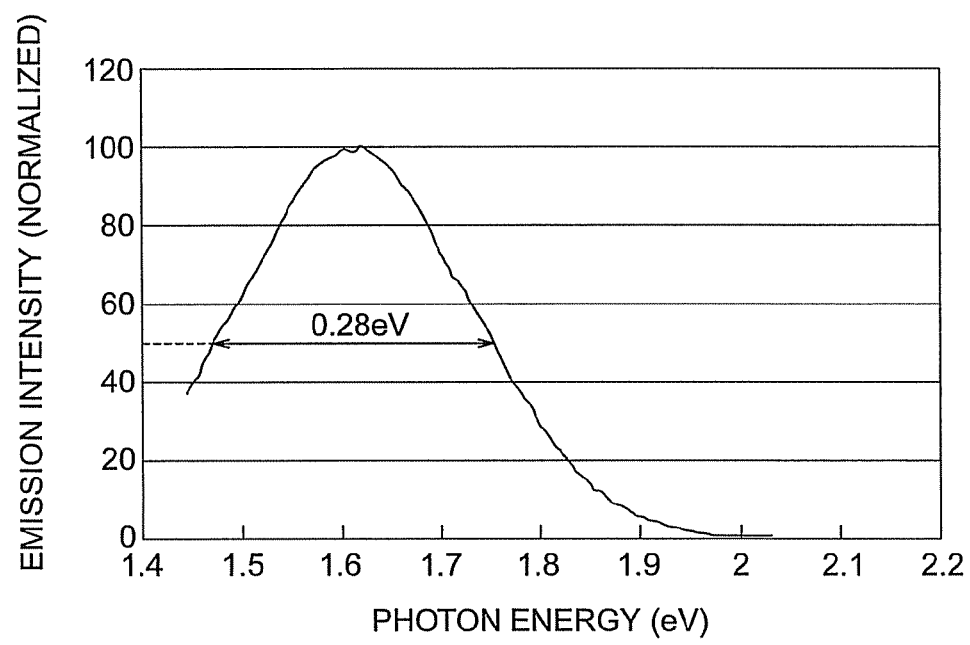
FIG. 2 is a diagram obtained by converting a wavelength represented by the horizontal axis in the emission spectrum shown in FIG. 1 into photon energy.

Then, the emission spectrum of the powdery light-emitting material was measured by irradiating it with X-rays under conditions where a tungsten anode tube was used, applied voltage was 120 kV, and a 30 mm-thick Al filter was used. From the measurement result, it has been found that, as shown in FIG. 1, the light-emitting material shows a band emission spectrum having a peak at about 690 nm in the long wavelength region. FIG. 2 shows an emission spectrum obtained by converting a wavelength represented by the horizontal axis in the emission spectrum shown in FIG. 1 into photon energy. It is to be noted that the conversion was performed using the following formula: photon energy=hc/λ, where h is a Planck's constant, c is the speed of light, and λ is the wavelength of light. As can be seen from FIG. 2, the half-width of the emission spectrum of the light-emitting material according to the first embodiment of the present invention was 0.28 eV.

Figure 3:
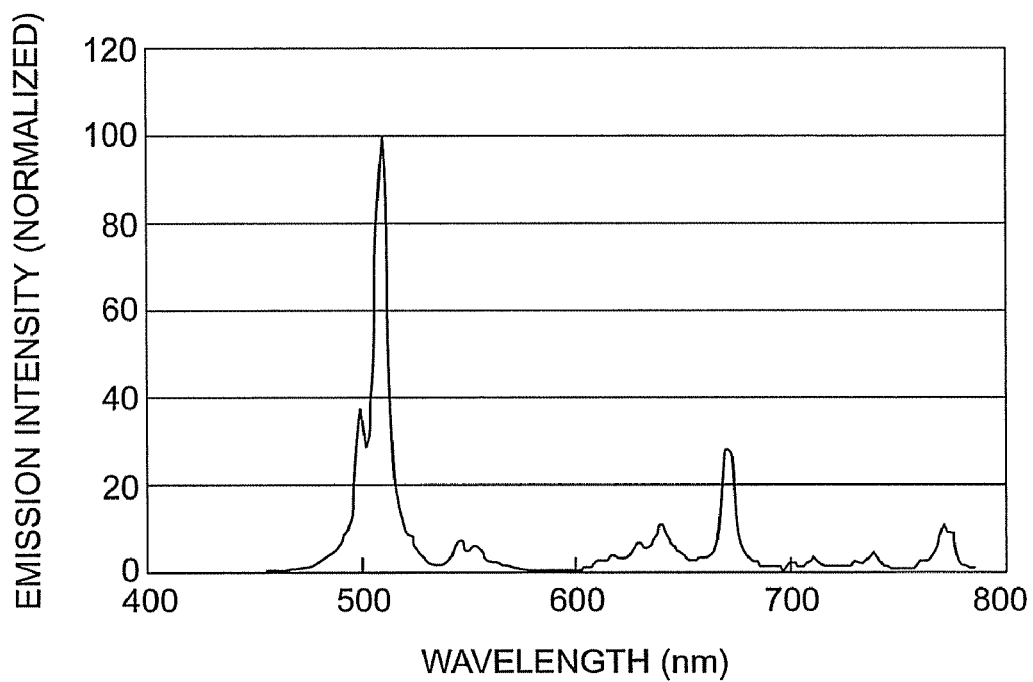
FIG. 3 is a diagram showing the emission spectrum of a light-emitting material of a comparative example composed of $Gd_2O_2S$:Pr.

As a comparative example, an existing light-emitting material composed of $Gd_2O_2S$:Pr was prepared. As shown in FIG. 3, a scintillator composed of the light-emitting material of the comparative example represented by $Gd_2O_2S$:Pr shows a line emission spectrum having a main peak at about 510 nm.

Using the emission spectrum of the light-emitting material according to the first embodiment of the present invention and the emission spectrum of the light-emitting material of the comparative example, the ratio of a current signal intensity obtained from a silicon photodiode when a light-emitting material used together with the silicon photodiode emitted light having unit energy was calculated between a case where a silicon photodiode was used together with the light-emitting material according to the first embodiment of the present invention and a case where a silicon photodiode was used together with the light-emitting material of the comparative example. As a result, the intensity of current signal of the case where the light-emitting material according to the first embodiment of the present invention represented by $NaYS_2$:

Eu was used was 125 when the intensity of current signal of the case where the light-emitting material of the comparative example represented by $Gd_2O_2S$:Pr was used was defined as 100, that is, the intensity of current signal of the case where the light-emitting material according to the first embodiment of the present invention was used was higher than that of the case where the light-emitting material of the comparative example was used.

A scintillator is preferably a single-crystalline or ceramic bulk from the viewpoint of its usage. However, the light-emitting material according to the first embodiment of the present invention is powdery. As a technique for obtaining a scintillator by sintering a powdery light-emitting material used as a raw material, there is known a method for producing a scintillator by hot isostatic pressing using a metal capsule, which is disclosed in JP-A 62-275072 (KOKAI). This method is suitable for obtaining a scintillator from a light-emitting material containing sulfur. A scintillator according to the first embodiment of the present invention is produced using this method. First, about 60 g of the powdery light-emitting material according to the first embodiment of the present invention composed of $NaYS_2$:Eu was formed into a cylindrical shape by press molding, and covered with a molybdenum foil, and enclosed in a cylindrical tantalum capsule. Then, the cylindrical capsule was subjected to hot isostatic pressing using argon gas at 1,200° C. and 2,000 atmospheres for 3 hours. After the completion of hot isostatic pressing, the capsule was removed to obtain a ceramic scintillator material represented by $NaYS_2$:Eu. The scintillator material was cut so as to have a length and a width which can meet size requirements varying depending on its purpose of use, such as for an X-ray detector, and a thickness which allows sufficient absorption of X-rays (e.g., 1 to 3 mm). In the case of the first embodiment of the present invention, the ceramic scintillator material was cut so as to have a length of about 4 mm, a width of about 1 mm, and a thickness of 2 mm, and was then polished to produce a scintillator.

It is to be noted that according to the first embodiment of the present invention, it is possible to decrease the temperature of hot isostatic pressing to about 1,000° C., and therefore an iron capsule having a lower melting point may also be used instead of the tantalum capsule.

Figure 4:
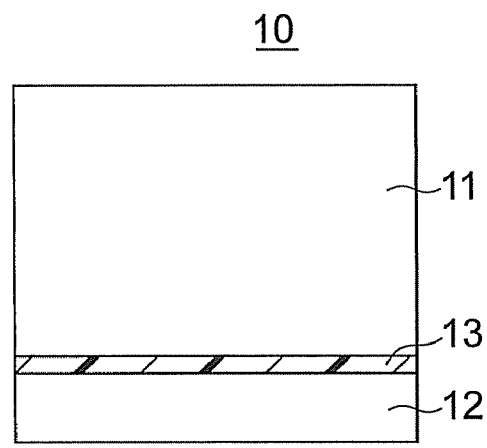
FIG. 4 is a sectional view of an X-ray detector element.

Then, as shown in FIG. 4, a scintillator 11 produced in the above manner and a silicon photodiode 12 to detect light from the scintillator 11 were bonded together using an optically-transparent adhesive such as an epoxy resin-based adhesive 13 to produce an X-ray detector element 10.

Figure 5:
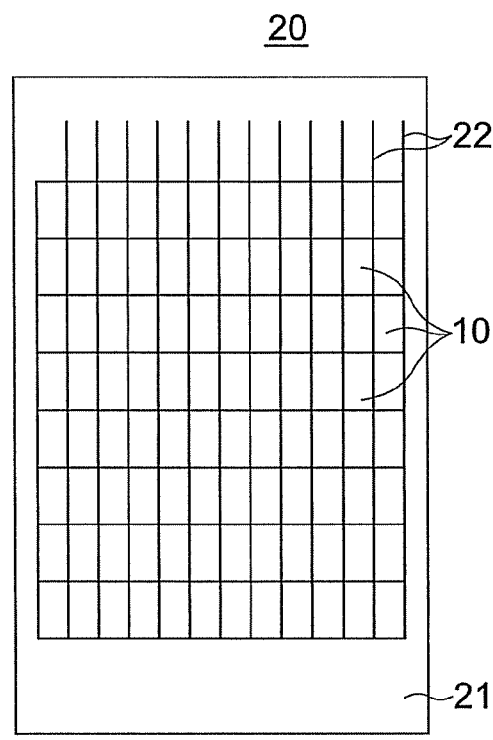
FIG. 5 is a block diagram of an X-ray detector array.

Then, as shown in FIG. 5, the detector elements 10 were arranged in a matrix form on a substrate 21 to produce an X-ray detector array 20 according to the first embodiment of the present invention. As shown in FIG. 5, the X-ray detector array 20 according to the first embodiment of the present invention has a structure in which the output from the detection elements 10 arranged in the same row is outputted to the outside through a common signal line 22.

On the other hand, another scintillator was produced using the light-emitting material of the comparative example composed of $Gd_2O_2S$:Pr so as to have the same form as the scintillator according to the first embodiment of the present invention. Then, the scintillator of the comparative example was bonded to a silicon photodiode to produce a detector element, and then the detector elements were arranged in a matrix form on a substrate to produce an X-ray detector array of a comparative example.

Both the X-ray detector arrays were irradiated with X-rays under conditions where a tungsten anode tube was used, applied voltage was 120 kV, and a 30 mm-thick Al filter was used to compare a photodiode output between them. As a result, the sensitivity of the X-ray detector according to the first embodiment of the present invention was 110% with respect to that of the X-ray detector of the comparative example.

Further, the X-ray detector according to the first embodiment of the present invention was irradiated with pulsed X-rays to determine its decay characteristics. As a result, it was confirmed that the decay time of the X-ray detector according to the first embodiment of the present invention, during which the output thereof decayed to 10%, was 10 μs or less.

As has been described above, according to the first embodiment of the present invention, it is possible to provide a light-emitting material having a short decay time of 10 μs or less and an emission wavelength of 650 nm or longer and showing an emission spectrum well matched with the sensitivity spectrum of a silicon photodiode, a scintillator containing the light-emitting material, and an X-ray detector equipped with the scintillator.

Although the first embodiment of the present invention uses $NaYS_2$ as a matrix, a light-emitting material represented by $ARS_2$:Eu, where A is at least one element selected from Na, K, Rb, and Cs and R is at least one element selected from Y, La, Gd, and Lu, can also produce the same effect as the first embodiment of the present invention. Such a light-emitting material represented by $ARS_2$:Eu is obtained by adding Eu to a matrix represented by $ARS_2$. The half-width of the emission spectrum of the light-emitting material is in the range of 0.25 to 0.35 eV. It is to be noted that the amount of Eu to be added is preferably about 3 mol % or less, more preferably 0.01 to 1 mol % because if the concentration of Eu to be added is too high, the luminous efficiency of the light-emitting material is lowered.

It is to be noted that the matrix represented by $ARS_2$ generally has a cubic or hexagonal crystal structure, but the present inventors have found that only the matrix having a hexagonal crystal structure allows light emission. A combination of A and R which allows light emission is either a combination of Na as A and any one of Y, Gd, and Lu as R or a combination of at least one of K, Rb, and Cs as A and any one of Y, La, Gd, and Lu as R. For example, the matrix represented by $NaLaS_2$ having a NaCl-type cubic crystal structure is not suitable for practical use because, as will be described later, an obtained light-emitting material do not emit light or the emission intensity of the light-emitting material is very weak.

Among these light-emitting materials represented by $ARS_2$:Eu, the light-emitting material represented by $NaGdS_2$:Eu will be described as a second embodiment of the present invention.

Second Embodiment

The light-emitting material according to the second embodiment of the present invention can be produced in the following manner.

First, 20.49 g of $Na_2S$, 102.4 g of $Gd_2S_3$, and 0.264 g of $Eu_2O_3$ as raw materials were weighed, and were then fired in a hydrogen sulfide atmosphere at 1,000° C. for 3 hours to obtain a light-emitting material according to the second embodiment of the present invention. The obtained light-emitting material also had a pink color. The light-emitting material according to the second embodiment of the present invention was excited by a pulsed electron beam having an acceleration voltage of 10 kV to evaluate the decay characteristics of the light-emitting material. As a result, the decay time of the light-emitting material, during which the emission intensity thereof was reduced to 10%, was 7 μs. From the result, it was confirmed that the light-emitting material had a sufficiently short decay time of 10 μs or less.

Figure 6:
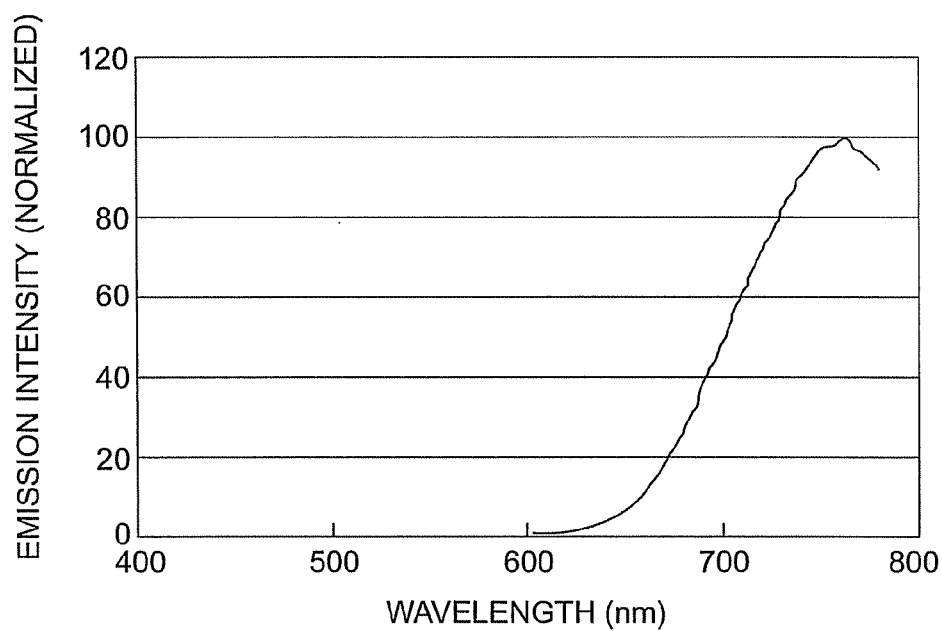
FIG. 6 is a diagram showing the emission spectrum of a light-emitting material according to a second embodiment composed of $NaGdS_2$:Eu.

Further, the emission spectrum of the light-emitting material according to the second embodiment of the present invention was measured by irradiating it with X-rays under conditions where a tungsten anode tube was used, applied voltage was 120 kV, and a 30 mm-thick Al filter was used. As can be seen from FIG. 6, the light-emitting material shows a band emission spectrum having a peak at about 750 nm in the sufficiently long wavelength region. The half-width of an emission spectrum obtained by converting a wavelength in the emission spectrum shown in FIG. 6 into photon energy was 0.29 eV. The signal intensity of current obtained from a silicon photodiode when the light-emitting material according to the second embodiment of the present invention used together with the silicon photodiode emitted light having unit energy was calculated from the emission spectrum. As a result, the signal intensity of current of a case where the light-emitting material according to the second embodiment of the present invention represented by $NaGdS_2$:Eu was used was 132 when the signal intensity of current of a case where the light-emitting material of the comparative example represented by $Gd_2O_2S$:Pr described with reference to the first embodiment of the present invention was used was defined as 100, that is, the signal intensity of current of the case where the light-emitting material according to the second embodiment of the present invention was used was higher than that of the case where the light-emitting material of the comparative example was used.

As has been described above, according to the second embodiment of the present invention, it is possible to provide a light-emitting material having a short decay time of 10 μs or less and an emission wavelength of 650 nm or longer and showing an emission spectrum well matched with the sensitivity spectrum of a silicon photodiode.

Other than the light-emitting materials described with reference to the first and second embodiments, light-emitting materials represented by $NaYS_2$:Eu were experimentally produced by changing the molar ratio of $Eu_2O_3$ to 0.01 and 0.001, respectively. The wavelength of the emission peak of the former was shifted to about 700 nm and the wavelength of the emission peak of the latter was about 690 nm, and both the light-emitting materials emitted light in the long wavelength region.

On the other hand, $Li_2S$, $Y_2S_3$, and $Eu_2O_3$ as raw materials were weighed and mixed in a ratio of 1.05:0.997:0.003, and the mixture was fired in a hydrogen sulfide atmosphere at 1,000° C. for 3 hours to prepare a sample. At the same time, $Na_2S$, $La_2S_3$, and $Eu_2O_3$ as raw materials were weighed and mixed in a ratio of 1.05:0.997:0.003, and the mixture was fired in a hydrogen sulfide atmosphere at 1,000° C. for 3 hours to prepare another sample. Each of the samples was milled in a mortar, and was then tried to be washed with water, but there was a sign indicating that part of the light-emitting material would be dissolved in water. Therefore, each of the samples not being washed with water was evaluated by comparing emission intensity with the above-described powder of $NaYS_2$:Eu. The emission intensity of each of the samples was measured by excitation by an electron beam having an acceleration voltage of 10 kV. As a result, both the samples had an emission energy of less than 1% of that of the above-described powder of $NaYS_2$:Eu.

Third Embodiment

A light-emitting material according to a third embodiment of the present invention has a matrix having a composition represented by $ARS_2$, where A represents at least one element selected from Na, K, Rb, and Cs, and R represents at least one element selected from Y, La, Gd, and Lu. Examples of an activator to be used include rare-earth elements such as Ce, Pr, Eu, and Tb, transition metals such as Mn and Cu, and In, Sn, Sb, and Bi which become an ion having two s electrons and emit light by transition as in the case of $Tl^+$. It is to be noted that the activator refers to an element doped so as to be a luminescent center. It is generally known that there is an optimum concentration of the activator, and in either case where the amount of the activator is too much or too little, emission characteristics such as luminous efficiency are deteriorated. The optimum concentration varies depending on the kind of matrix used and the kind of activator ion used, but often lies in the range of about 0.01 to 10 mol %. $NaYS_2$ doped with Ce, that is, $NaYS_2$:Ce is shown in a literature (R Dorenbos: J. Lumin. 91 (2000) pp. 155-176), but in this literature, there is no description that $NaYS_2$:Ce emits light. Therefore, it can be considered that there is a possibility that the material represented as $NaYS_2$:Ce in this literature is different from an intended material. As far as the present inventors know, there are no known light-emitting materials whose matrix has a composition represented by $ARS_2$ including $NaYS_2$.

As described above, the matrix represented by $ARS_2$ has a cubic or hexagonal crystal structure, but the present inventors have found that also in a case where the activator is an element other than Eu, only the matrix having a hexagonal crystal structure allows strong light emission. A combination of A and R which allows light emission is either a combination of Na as A and any one of Y, Gd, and Lu as R or a combination of at least one of K, Rb, and Cs as A and any one of Y, La, Gd, and Lu as R. For example, the matrix represented by $NaLaS_2$ having a NaCl-type cubic crystal structure is not suitable for practical use because an obtained light-emitting material do not emit light or the emission intensity of the light-emitting material is very weak.

The phosphor according to the third embodiment of the present invention can be synthesized by firing compounds, such as sulfides and oxides, each containing a metal element constituting the phosphor in an atmosphere containing sulfur such as hydrogen sulfide. However, it is important to control the atmosphere during firing. If the compounds are fired in an atmosphere containing oxygen, the phosphor is easily oxidized, and therefore it is necessary to fire the compounds in an atmosphere whose oxygen content is as low as possible. In a case where a material containing oxygen, such as an oxide, is used as a raw material, it is necessary to carry out firing in a reducing atmosphere, such as hydrogen sulfide, to remove oxygen. Further, it is also important to control the temperature of firing. If the temperature of firing is too high, there is a case where an alkali metal constituting the matrix is volatilized or the crystal structure of the matrix is transformed into a cubic crystal structure, thereby significantly lowering the emission intensity of the phosphor. The upper limit of the firing temperature depends on the combination of elements constituting the matrix, but is preferably about 1,200° C. based on findings of the present inventors.

In a case where Mn, Cu, In, Sn, Sb, or Bi is used as an activator, the band emission spectrum of the matrix doped with the activator depends on the combination of elements constituting the matrix. Particularly, the present inventors have found that in a case where Bi is used as an activator and $NaYS_2$ is used as a matrix, $NaYS_2$ doped with Bi shows an emission color almost equal to that of ZnS:Ag,Cl that is a typical fluorescent material excited by an electron beam, and achieves a high luminance exceeding that of ZnS:Ag,Cl under high energy-density electron beam excitation.

Further, in a case where Ce is used as an activator, the band emission spectrum of the matrix doped with Ce also depends on the combination of elements constituting the matrix, but light of orange to red is generally emitted and the light has an abnormally-long wavelength for light emitted from $Ce^{3+}$ ions.

Further, in a case where Pr is used as an activator, the matrix doped with Pr emits light having peaks at about 500 nm and 670 nm unique to the transition of $Pr^{3+}$ ions from the $^3P_0$ level. In a case where Tb is used as an activator, the matrix doped with Tb emits light having a main peak at about 550 nm unique to $Tb^{3+}$ ions.

Further, in a case where Eu is used as an activator, as described above with reference to the first embodiment, the matrix doped with Eu shows a band spectrum unique to $Eu^{2+}$ irrespective of the fact that the matrix contains a trivalent rare-earth element. It is known that in a case where Eu is added to a matrix containing an alkaline-earth metal, Eu often exists as $Eu^{2+}$, and a band spectrum unique to $Eu^{2+}$ is shown. Therefore, a phenomenon in which emission unique to $Eu^{2+}$ is observed even when the Eu-doped matrix not containing an alkaline-earth metal is used is very rare.

Further, two or more of the activation materials mentioned above may be used together. For example, in a case where $NaYS_2$ is doped with Bi and Pr, light having peaks at about 440 nm, 500 nm, and 670 nm is emitted.

Fourth Embodiment

Figure 7:
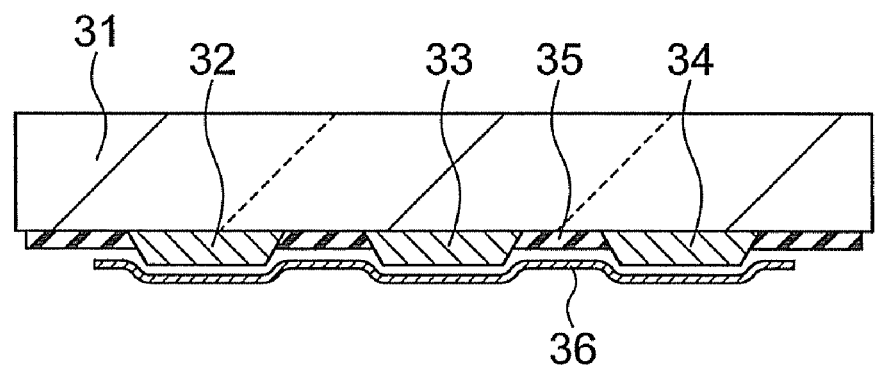
FIG. 7 is a sectional view of an image display device according to a fourth embodiment.
Figure 7:
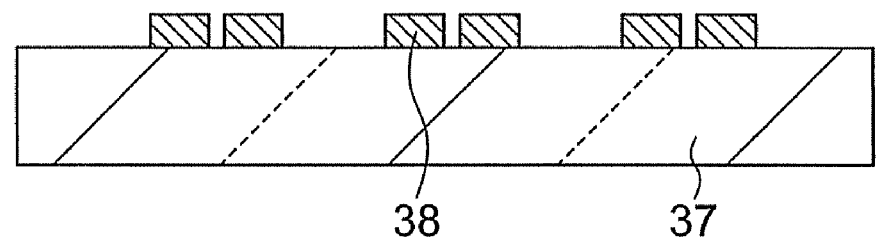

Hereinbelow, an image display device according to a fourth embodiment of the present invention will be described with reference to FIG. 7. FIG. 7 is a fragmentary sectional view of the image display device according to the fourth embodiment of the present invention. The image display device according to the fourth embodiment of the present invention includes a front glass substrate 31, a blue light-emitting pixel 32, a green light-emitting pixel 33, and a red light-emitting pixel 34 which are formed on one of the surfaces of the glass substrate 31, a black matrix 35 surrounding the pixels, an aluminum thin film 36 covering the pixels, a back substrate 37 provided so as to be opposed to the glass substrate 31, and electron beam sources 38 provided on the surface of the back substrate 37 opposed to the glass substrate 31 so as to be opposed to the pixels. These electron beam sources 38 are surface-condition Electron-Emitters (SCEs). When the electron beam sources 38 emit electrons toward the pixels opposed to the electron beam sources 38, the electrons are introduced into the pixels and then the pixels emit light. The light emitted from the pixels is seen by a person from the other surface side of the glass substrate 31 opposite to the surface where the pixels are formed. In the image display device according to the fourth embodiment of the present invention, a material represented by $ARS_2$:Bi, where $ARS_2$ is a matrix and Bi is an activator, is used as a blue phosphor applied onto the blue light-emitting pixel 32. It is to be noted that in the fourth embodiment of the present invention, the green light-emitting pixel 33 is coated with a green light-emitting phosphor such as $Y_2SiO_5$:Tb, and the red light-emitting pixel 34 is coated with a red light-emitting phosphor such as $Y_2O_3$:Eu.

As has been described above, in the fourth embodiment of the present invention, since the blue phosphor represented by $ARS_2$:Bi is used instead of a conventional blue phosphor such as ZnS:Ag,Cl, it is possible to obtain high-luminance blue light emission without significantly reducing luminous efficiency even under high-luminance or high energy-density excitation. It is to be noted that the matrix of the blue phosphor is preferably $NaYS_2$ in order to obtain an emission color equal to that of a conventional blue phosphor such as ZnS:Ag,Cl or ZnS:Ag,Al.

Figure 8:
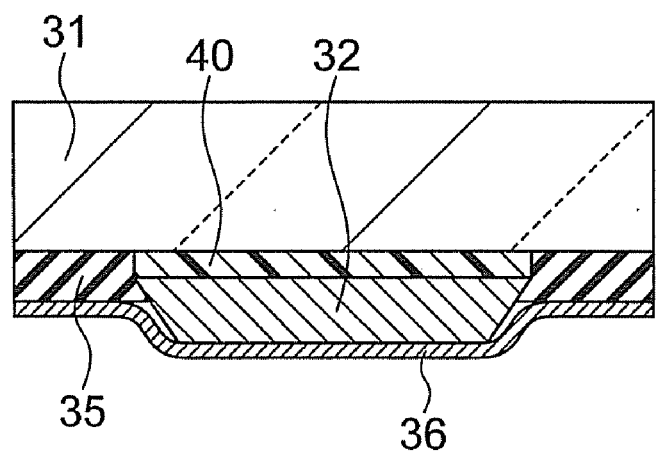
FIG. 8 is a sectional view of a blue light-emitting pixel of an image display device according to a modification of the fourth embodiment.

As shown in FIG. 8, an image display device according to a modification of the fourth embodiment of the present invention may have a filter layer 40, through which blue light can selectively pass, between the blue light-emitting pixel 32 and the front glass substrate 31. It is to be noted that a filter layer 40, through which green light can selectively pass, may be provided between the green light-emitting pixel 33 and the front glass substrate 31, and a filter layer 40, through which red light can selectively pass, may be provided between the red light-emitting pixel 34 and the front glass substrate 31.

Fifth Embodiment

Figure 20:
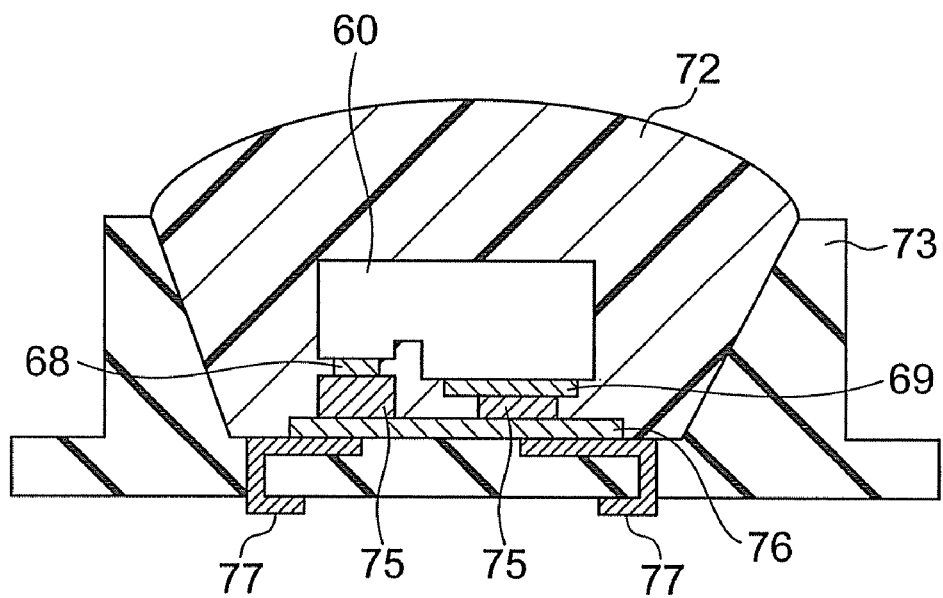
FIG. 20 is a sectional view of a light source according to a fifth embodiment.

Hereinbelow, a light source according to a fifth embodiment of the present invention will be described with reference to FIG. 20. The light source according to the fifth embodiment of the present invention is produced by combining a phosphor represented by $ARS_2$:Bi,Pr and a near-ultraviolet light-emitting diode used as a light-emitting device. The near-ultraviolet light-emitting diode refers to a light-emitting diode (LED) whose peak wavelength is shorter than about 400 nm. The light source according to the fifth embodiment of the present invention has a structure in which a near-ultraviolet light-emitting diode 60 is flip-chip mounted on a submount 76 provided in a ceramic package (enclosure) 73, and is sealed with a resin 72 having a phosphor represented by $ARS_2$:Bi,Pr dispersed therein. In the light source according to the fifth embodiment of the present invention, the submount 76 is formed on lead electrodes 77 penetrating the bottom of a recess of the ceramic package 73. On the submount 76, a pair of bumps 75 is provided. A pair of electrodes 68 and 69 of the light-emitting diode 60 is connected to the pair of bumps 75 to flip-chip mount the light-emitting diode 60 on the surmount 76. Examples of the bump 75 include metal bumps and solder bumps, but a gold bump is preferably used. The bumps 75 and the lead electrodes 77 are electrically connected by a conductive wire such as a gold wire which penetrates the submount 76 to connect the bumps 75 and the lead electrodes 77 to each other. The lead electrodes 77 are required to have good electrical conductivity. Examples of the material of the lead electrodes 77 include iron, copper, and copper alloys, and those coated with a metal such as silver, aluminum, or gold.

As described above, the light-emitting diode 60 provided in the ceramic package 73 is hermetically sealed with the resin 72. The resin 72 contains a phosphor represented by $ARS_2$:Bi,Pr dispersed therein, and the phosphor absorbs at least part of light emitted from the light-emitting diode 60 and emits light having a wavelength different from that of light emitted from the light-emitting diode 60.

Since the light source according to the fifth embodiment of the present invention has the structure described above, part of light emitted from the light-emitting diode 60 is subjected to wavelength conversion by the phosphor dispersed in the sealing resin 72 when passing through the sealing resin 72. The light subjected to wavelength conversion and light passing through the sealing resin 72 without being subjected to wavelength conversion are mixed, and therefore it is possible to obtain white light capable of achieving a wider color reproduction range.

In a case where the light source according to the fifth embodiment of the present invention is used as a backlight of a liquid crystal display, the matrix of the phosphor is preferably $NaYS_2$ because the peak wavelength of a blue light-emitting component of the phosphor is preferably short to widen the color reproduction range of the liquid crystal display.

Figure 21:
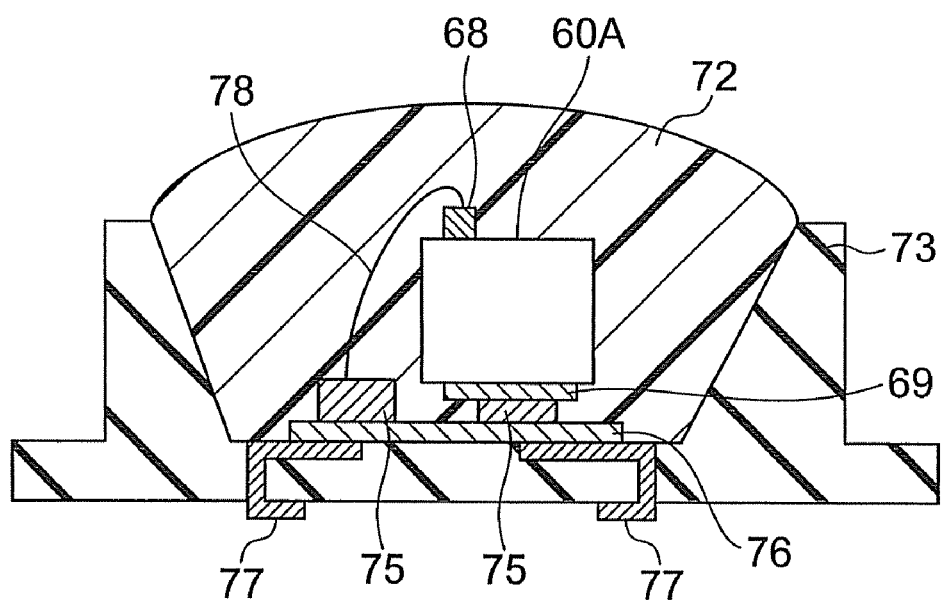
FIG. 21 is a sectional view of a light source according to a modification of the fifth embodiment.

It is to be noted that in the light source according to the fifth embodiment of the present invention, the pair of the electrodes 68 and 69 of the light-emitting device is provided on one side of the light-emitting device, but as shown in FIG. 21, a light-emitting device 60A having electrodes 68 and 69 provided on opposite sides thereof may alternatively be used. In this case, the electrode 68 is electrically connected to a pad 75 via a bonding wire 78. The n-side electrode 68 is brought into contact with an n-type GaN substrate. It is to be noted that the positional relation between the n-side electrode 68 and the p-side electrode 69 may be reversed.

In the light source according to the fifth embodiment of the present invention, the light-emitting diode is used as an example of a light-emitting device, but a semiconductor laser device may alternatively be used as a light-emitting device.

Hereinbelow, the third to fifth embodiments of the present invention will be described in detail with reference to the following examples.

Example 1

$Na_2S$, $Y_2S_3$, and $Bi_2O_3$ as raw materials were mixed in a molar ratio of 1.1:0.999:0.001, and more specifically 21.5 g of $Na_2S$, 68.3 g of $Y_2S_3$, and 0.116 g of $Bi_2O_3$ were weighed and mixed. The mixture was charged into a carbon crucible, and was then fired in a hydrogen sulfide atmosphere at 1,000° C. for 1.5 hours. The thus obtained fired product was milled in a mortar, washed with water, and dried to obtain a powdery phosphor of Example 1 composed of $NaYS_2$:Bi. A fluorescent screen of the phosphor was formed on a glass substrate by a precipitation method using an aqueous barium salt solution and water glass. Then, an organic film was formed, and aluminum was evaporated onto the organic film and baked to form an aluminum thin film on the back surface of the fluorescent screen.

Figure 9:
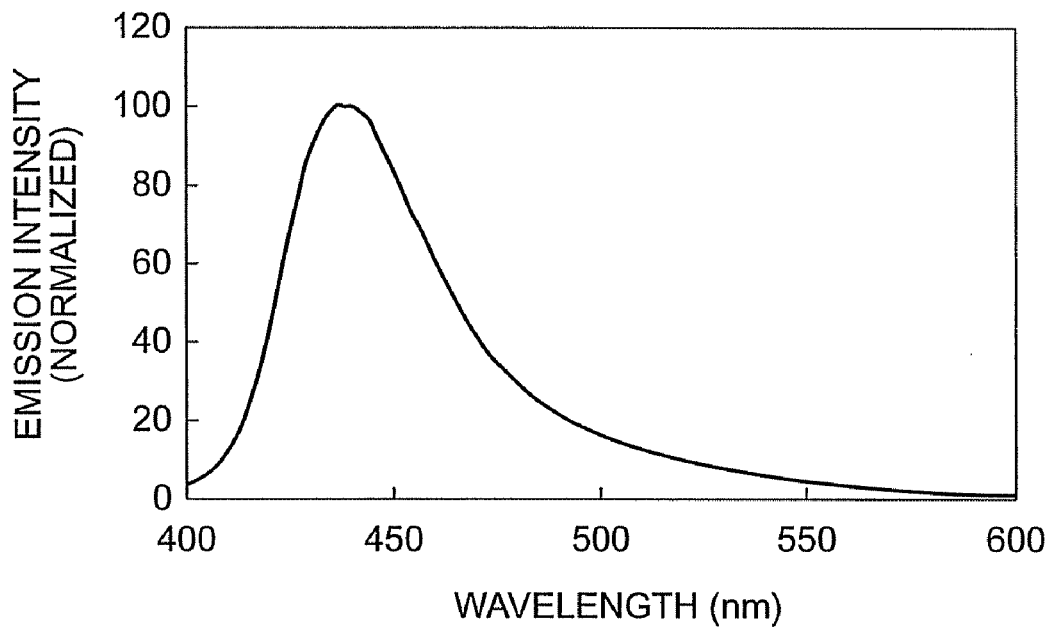
FIG. 9 is a diagram showing the electron beam-excited emission spectrum of a fluorescent screen using a phosphor of Example 1.

A fluorescent screen of a comparative example was prepared using a known phosphor represented by ZnS:Ag,Cl in the same manner as in the comparative example. Each of the fluorescent screens was excited by a pulse-driven electron beam having an acceleration voltage of 10 kV, a pulse width of 100 µs, and a current density of about 5 mA/cm² to measure a luminance. The fluorescent screen using the phosphor of the Example 1 showed a high luminance of 136% with respect to that of the fluorescent screen using the phosphor of the comparative example. FIG. 9 shows the emission spectrum of the fluorescent screen using the phosphor of the Example 1. The chromaticity of light emitted from the fluorescent screen of the Example 1 was (0.154, 0.096), which indicates that the phosphor of the Example 1 can be sufficiently used as a blue light-emitting phosphor.

Further, the phosphor of the Example 1 was applied onto the blue light-emitting pixel 32 of the image display device according to the fourth embodiment of the present invention shown in FIG. 7 to prepare a display panel. On the other hand, the phosphor of the comparative example composed of ZnS:Ag,Cl was applied as a blue phosphor onto the blue light-emitting pixel 32 to prepare a display panel for the purpose of comparison. The luminance of blue light emitted under drive conditions where the maximum luminance was achieved was compared between the display panel using the phosphor of the Example 1 and the display panel using the phosphor of the comparative example. As a result, the luminance of the display panel using the phosphor of the Example 1 was 120% with respect to that of the display panel using the phosphor of the comparative example.

Example 2

Figure 10:
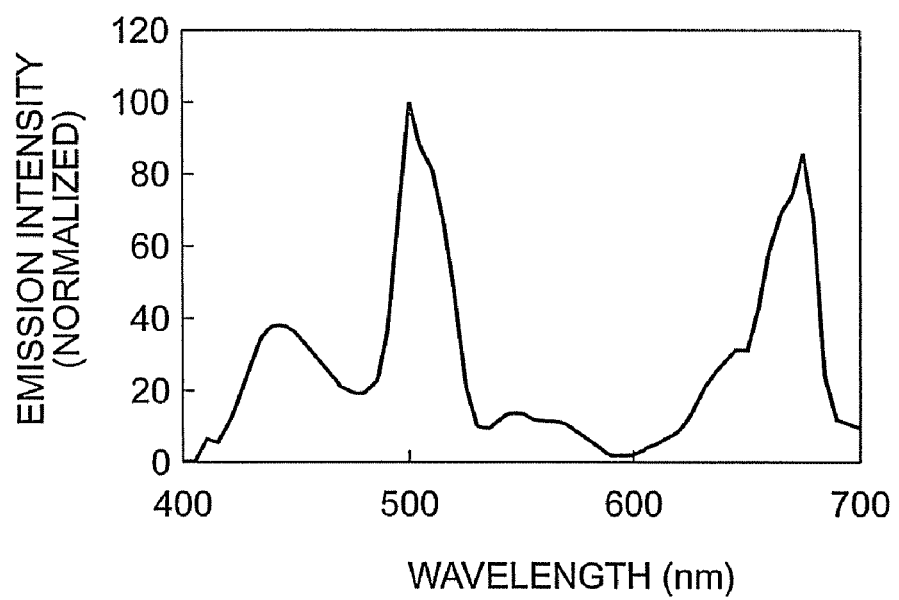
FIG. 10 is a diagram showing the emission spectrum of a phosphor of Example 2 excited by near-ultraviolet light.

$Na_2S$, $Y_2S_3$, $Bi_2O_3$, and $Pr_6O_{11}$ as raw materials were mixed in a molar ratio of 1.05:0.996:0.001:0.003, and more specifically, 20.5 g of $Na_2S$, 68.3 g of $Y_2S_3$, 0.129 g of $Bi_2O_3$, and 0.766 g of $Pr_6O_{11}$ were weighed and mixed. The mixture was charged into a carbon crucible, and was then fired in a hydrogen sulfide atmosphere at 1,000° C. for 1.5 hours. The thus obtained fired product was milled in a mortar, washed with water, and dried to obtain a powdery phosphor of Example 2 composed of $NaYS_2$:Bi,Pr. The phosphor was excited by a near-ultraviolet LED, whose peak wavelength was about 385 nm, to measure its emission spectrum. FIG. 10 shows the emission spectrum of the phosphor of the Example 2.

Figure 11:
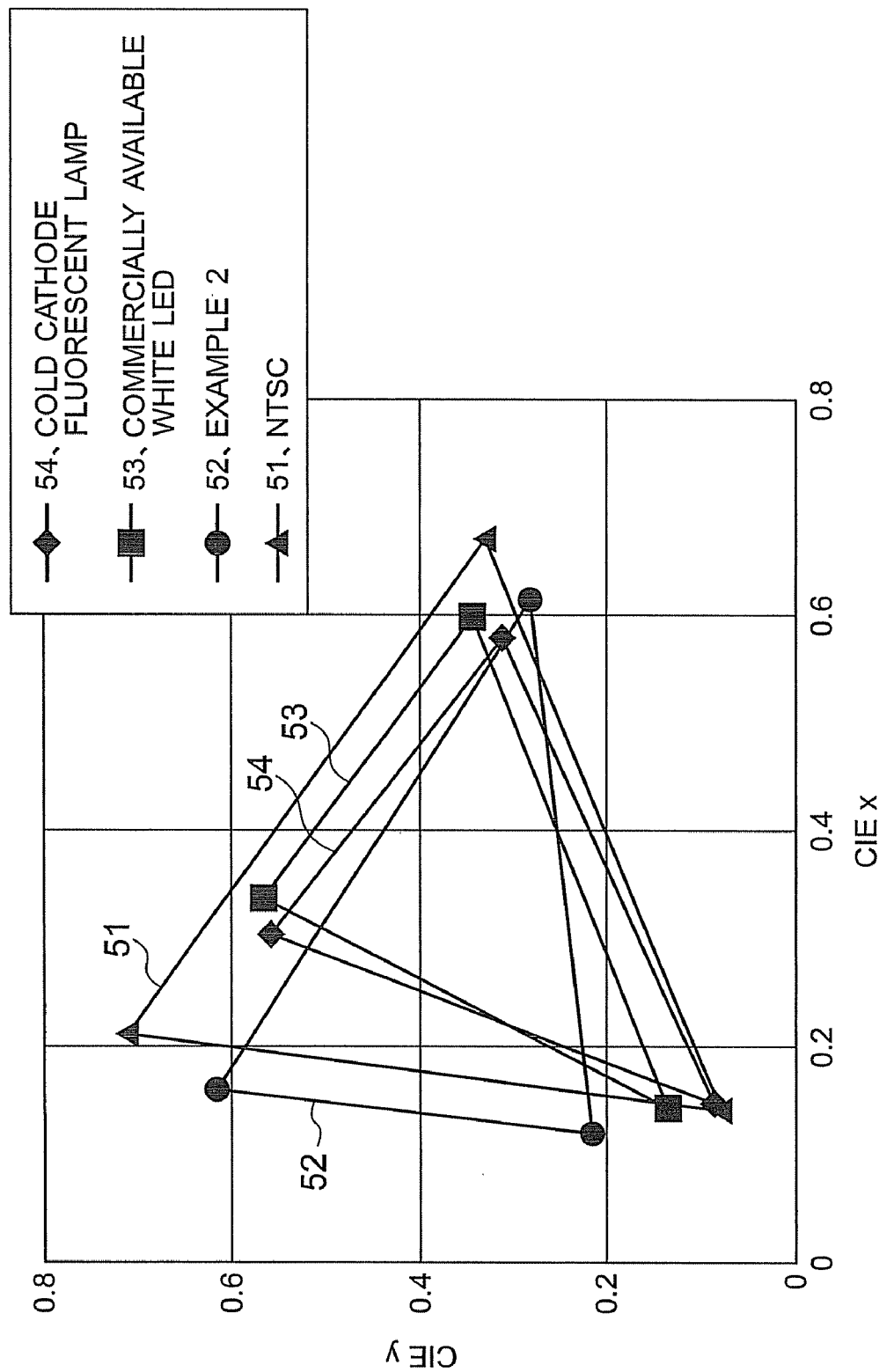
FIG. 11 is a diagram showing a color reproduction range based on the NTSC standard and color reproduction ranges of liquid crystal displays different in light source used together with color filters.
Figure 12:
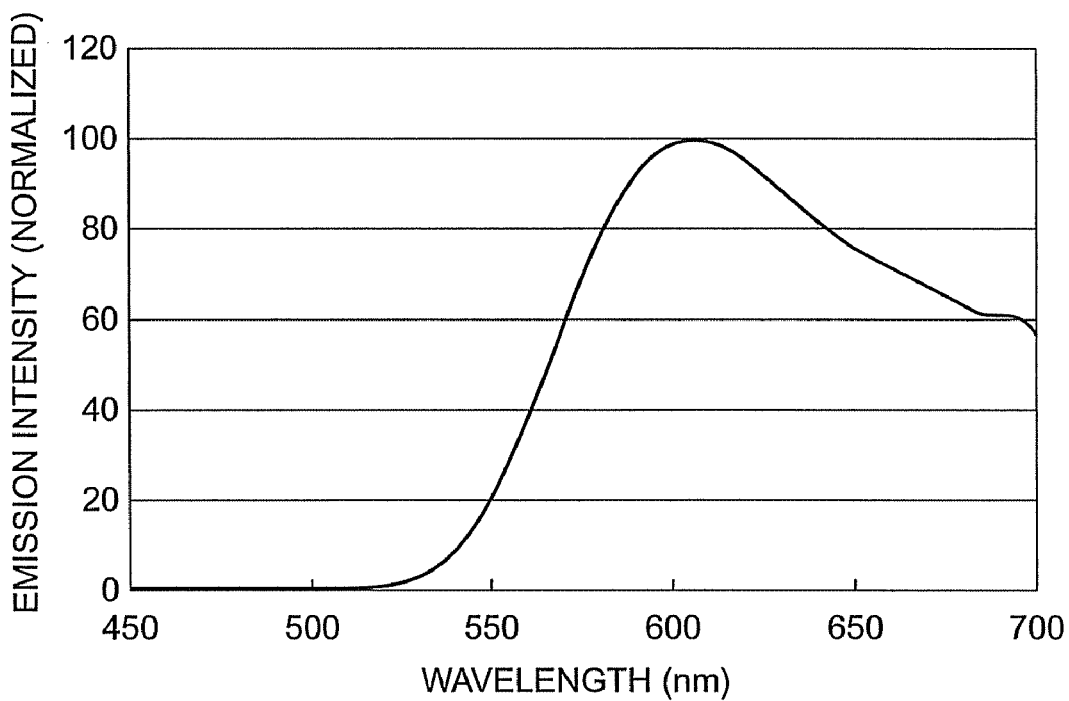
FIG. 12 is a diagram showing the emission spectrum of a phosphor of Example 3 excited by ultraviolet light having a wavelength of 254 nm.
Figure 13:
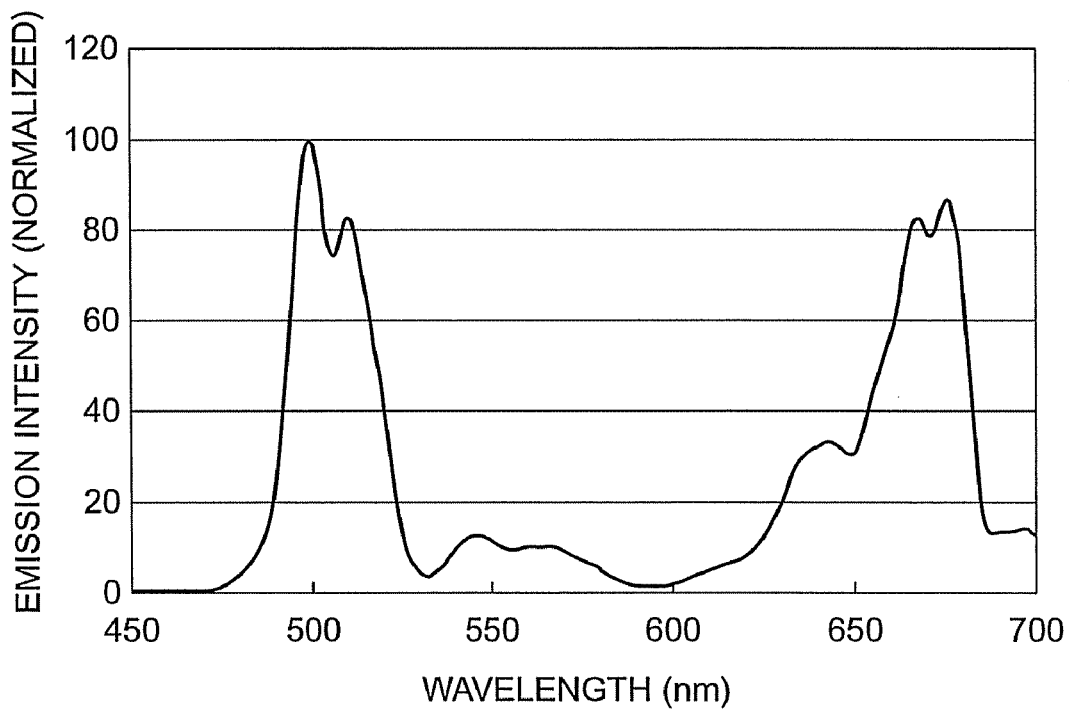
FIG. 13 is a diagram showing the emission spectrum of a phosphor of Example 5 excited by ultraviolet light having a wavelength of 254 nm.
Figure 14:
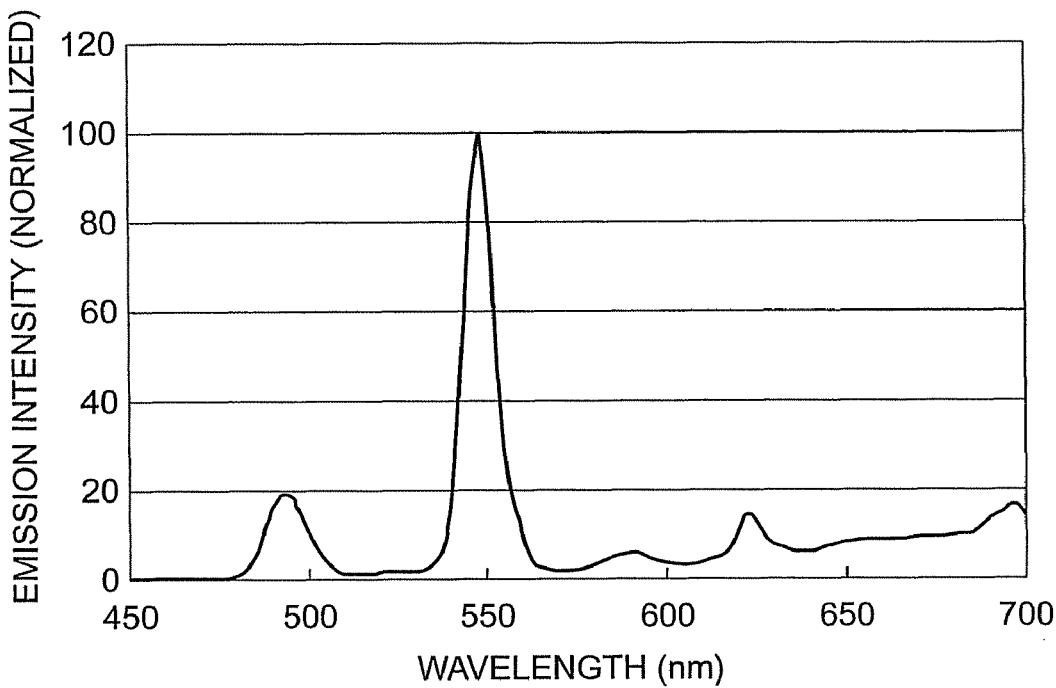
FIG. 14 is a diagram showing the emission spectrum of a phosphor of Example 6 excited by ultraviolet light having a wavelength of 254 nm.
Figure 15:
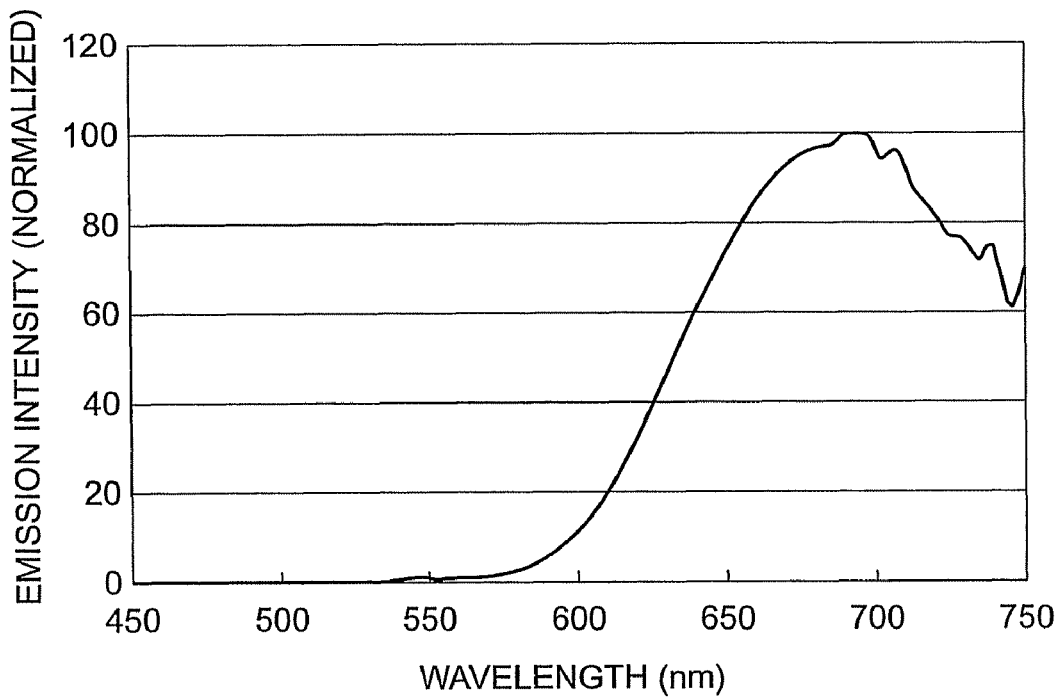
FIG. 15 is a diagram showing the emission spectrum of a phosphor of Example 7 excited by ultraviolet light having a wavelength of 254 nm.
Figure 16:
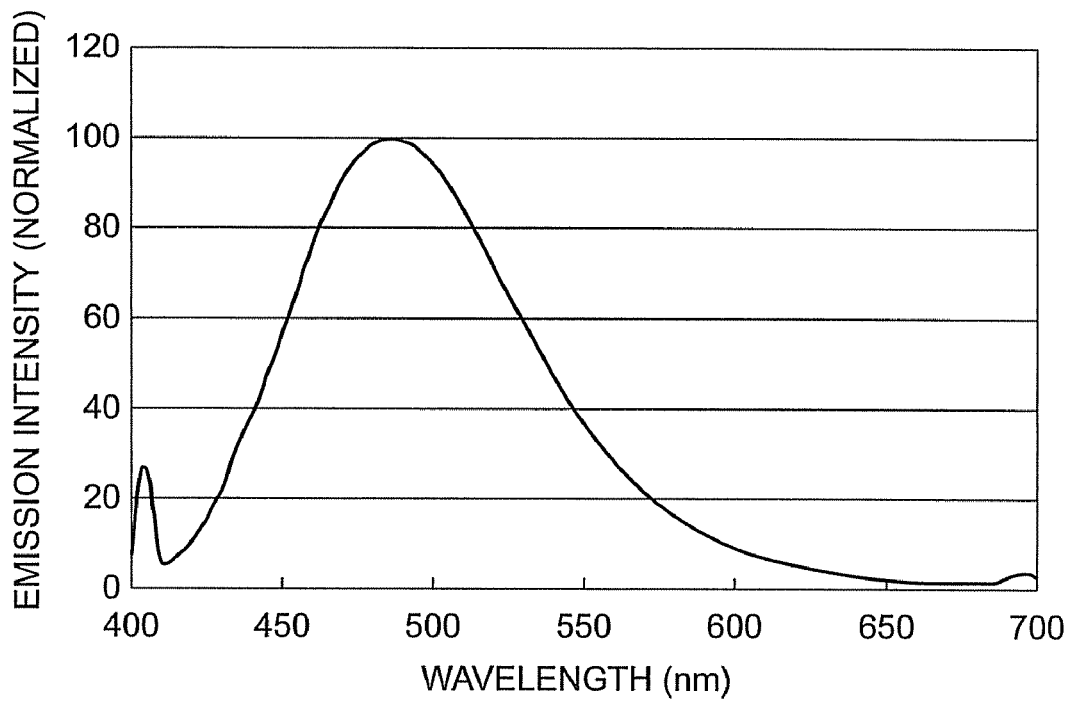
FIG. 16 is a diagram showing the emission spectrum of a phosphor of Example 8 excited by ultraviolet light having a wavelength of 254 nm.
Figure 17:
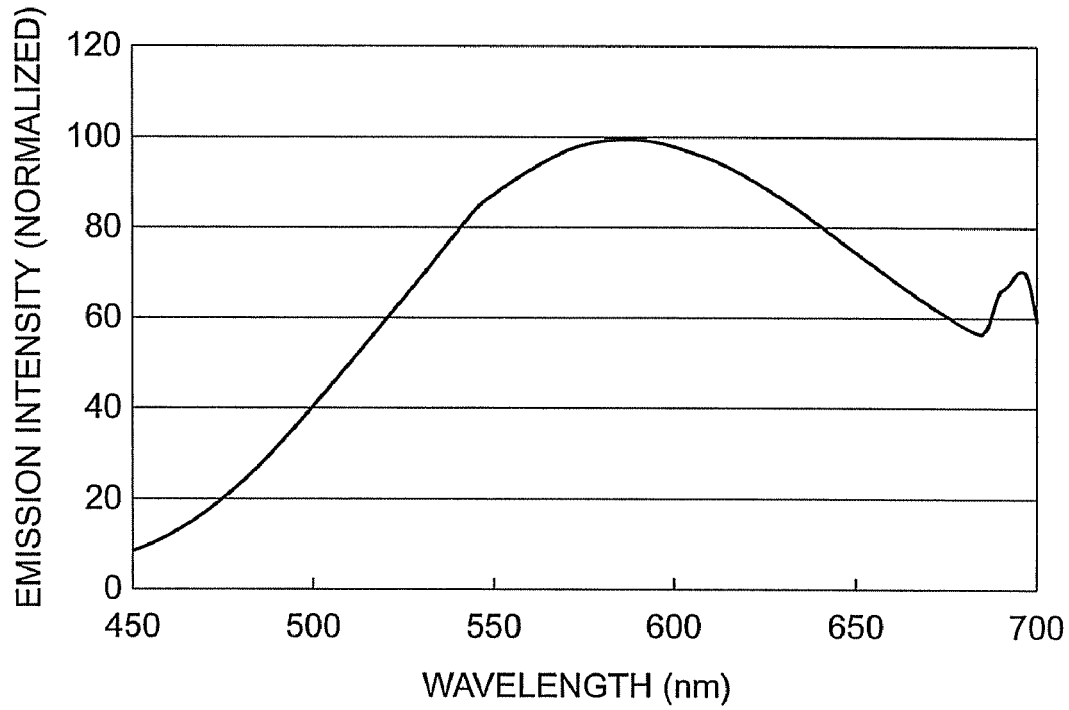
FIG. 17 is a diagram showing the emission spectrum of a phosphor of Example 9 excited by ultraviolet light having a wavelength of 254 nm.
Figure 18:
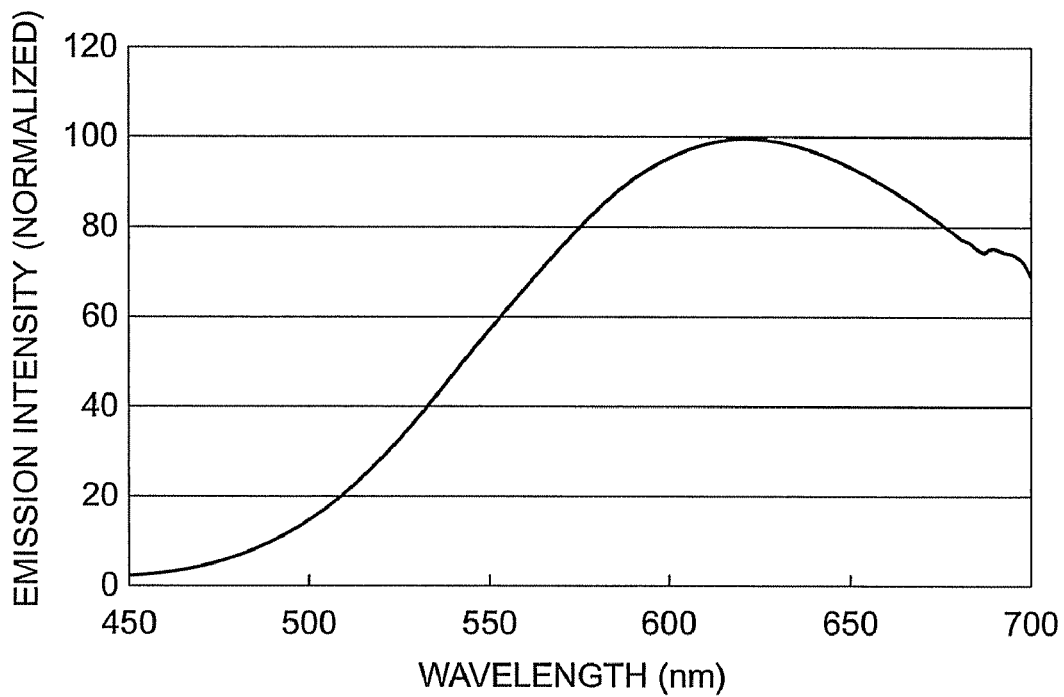
FIG. 18 is a diagram showing the emission spectrum of a phosphor of Example 11 excited by ultraviolet light having a wavelength of 254 nm.
Figure 19:
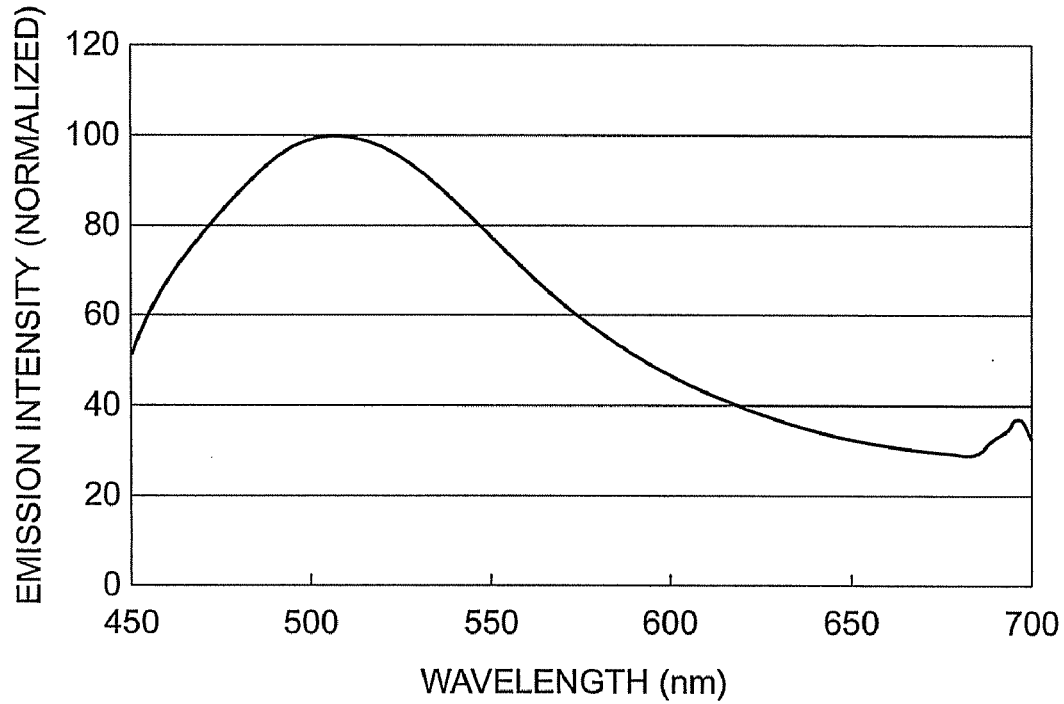
FIG. 19 is a diagram showing the emission spectrum of a phosphor of Example 12 excited by ultraviolet light having a wavelength of 254 nm.

Then, a white LED light source was produced by forming, on a near-ultraviolet LED device, a resin layer having the phosphor of the Example 2 dispersed therein. The light source was used together with blue, green, and red color filters for use in a liquid crystal display to measure the chromaticity coordinates of blue, green, and red light on the x-y chromaticity diagram. As a result, as shown in FIG. 11, the chromaticity coordinates of blue light were (0.12, 0.21), the chromaticity coordinates of green light were (0.16, 0.61), and the chromaticity coordinates of red light were (0.61, 0.28). The area of a triangle 52 formed by connecting the blue, green, and red chromaticity coordinates on the chromaticity diagram was 63% of that of a triangle 51 formed based on the NTSC that is a typical standard. On the other hand, in a case where a cold cathode fluorescent lamp using an existing phosphor was used as a light source, the area of a resultant triangle 54 was 53% of that of the triangle 51 formed based on the NTSC. In a case where a commercially available white LED composed of a blue LED and a yellow light-emitting phosphor was used as a light source, the area of a resultant triangle 53 was 49% of that of the triangle 51 formed based on the NTSC. It is apparent from these results that when used as a backlight, the light source using the phosphor of the Example 2 can provide a wider color reproduction range than the existing light sources.

Further, phosphors of Examples 3 to 13 shown in Table 1 were produced. These phosphors were irradiated with ultraviolet light having a wavelength of 254 nm to observe their respective emission colors. The emission colors of the phosphors are shown in Table 1.

TABLE 1

| | Matrix | Activator | Concentration of Activator (mol %) | Emission Color |
|---|---|---|---|---|
| Example 3 | $NaYS_2$ | Ce | 1 | Red |
| Example 4 | $NaGdS_2$ | Ce | 1 | Red |
| Example 5 | $NaYS_2$ | Pr | 1 | Yellow |
| Example 6 | $NaYS_2$ | Tb | 3 | Green |
| Example 7 | $NaYS_2$ | Mn | 1 | Red |
| Example 8 | $NaYS_2$ | Cu | 1 | Blue |

TABLE 1-continued

| | Matrix | Activator | Concentration of Activator (mol %) | Emission Color |
|---|---|---|---|---|
| Example 9 | NaYS$_2$ | In | 1 | Yellow |
| Example 10 | NaYS$_2$ | Sn | 0.3 | Yellow |
| Example 11 | NaYS$_2$ | Sb | 1 | Orange |
| Example 12 | NaGdS$_2$ | Bi | 1 | Blue Green |
| Example 13 | NaYS$_2$ | Eu | 0.3 | Red |

FIGS. 12 to 19 show the emission spectra of the phosphors of the Examples 3, 5, 6, 7, 8, 9, 11 and 12 excited by ultraviolet light having a wavelength of 254 nm.

As has been described above, according to the present invention, it is possible to provide a phosphor which emits light having a higher luminance than light emitted from a phosphor represented by ZnS and an excellent emission color under excitation by a high energy-density electron beam and which achieves a wider color reproduction range when used together with color filters of a liquid crystal display, an image display device using the phosphor, and a light source using the phosphor.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A light-emitting material comprising a material having a composition represented by ARS$_2$:Eu, wherein A represents at least one element selected from Na, K, Rb, and Cs, and R represents at least one element selected from Y, La, Gd, and Lu, wherein the material has a short decay time of 10 μl or less and an emission wavelength of 650 nm or longer, and the half-width of the emission spectrum of the material is in the range of 0.25 eV to 0.35 eV.

2. The light-emitting material according to claim 1, wherein the matrix represented by ARS$_2$ has a hexagonal crystal structure.

3. The light-emitting material according to claim 1, wherein the matrix contains at least Na as A and at least Y as R.

4. The light-emitting material according to claim 1, wherein the material contains Na as A and at least one element selected from Y, Gd, and Lu as R or contains at least one element selected from K, Rb, and Cs as A and at least one element selected from Y, La, Gd, and Lu as R.

5. A scintillator comprising a light-emitting material according to claim 1.

6. The scintillator according to claim 5, wherein the material contains Na as A and at least one element selected from Y, Gd, and Lu as R or contains at least one element selected from K, Rb, and Cs as A and at least one element selected from Y, La, Gd, and Lu as R.

7. An X-ray detector comprising:
a scintillator according to claim 5; and
a silicon photodiode for receiving light emitted from the scintillator.

8. The X-ray detector according to claim 7, wherein the material contains Na as A and at least one element selected from Y, Gd, and Lu as R or contains at least one element selected from K, Rb, and Cs as A and at least one element selected from Y, La, Gd, and Lu as R.

9. An image display device comprising:
a first substrate;
a red light-emitting pixel for emitting red light, a green light-emitting pixel for emitting green light, and a blue light-emitting pixel for emitting blue light which are provided on the first substrate;
a second substrate provided so as to be opposed to the surface of the first substrate where the pixels are provided; and
a plurality of electron beam sources, each of which corresponds to each of the pixels and is provided on the surface of the second substrate opposed to the first substrate to emit an electron beam toward the corresponding pixel, wherein the blue-light emitting pixel contains a light-emitting material activated with Bi, the light-emitting material having a composition represented b ARS$_2$: Bi wherein A represents at least one element selected from Na, K, Rb, and Cs and R represents at least one element selected from Y, La, Gd, and Lu.

10. The image display device according to claim 9, further comprising a filter layer, through which blue light can selectively pass, between the first substrate and the blue light-emitting pixel.

11. A light source comprising:
a light-emitting material activated with Bi and Pr, having a composition represented by ARS$_2$:Bi, Pr, wherein A represents at least one element selected from Na, K, Rb, and Cs and R represents at least one element selected from Y, La, Gd, and Lu; and
a light-emitting device for irradiating the light-emitting material with light having a peak wavelength of 400 nm or less to excite the light-emitting material.

* * * * *